United States Patent [19]

Ikezawa et al.

[11] 4,107,727
[45] Aug. 15, 1978

[54] RESIN SEALED SEMICONDUCTOR DEVICE

[75] Inventors: Ryuichi Ikezawa; Atsushi Sasayama, both of Takasaki; Sakae Kikuchi, Kokubunji, all of Japan

[73] Assignee: Hitachi, Ltd., Tokyo, Japan

[21] Appl. No.: 819,053

[22] Filed: Jul. 26, 1977

[30] Foreign Application Priority Data

Jul. 28, 1976 [JP] Japan .................................. 51-89112

[51] Int. Cl.² .......................................... H01L 23/28
[52] U.S. Cl. ........................................ 357/72; 357/68; 357/81
[58] Field of Search ............................ 357/72, 81, 68

[56] References Cited

U.S. PATENT DOCUMENTS

| 3,475,662 | 10/1969 | Zido | 357/81 |
| 3,513,362 | 5/1970 | Yamamoto | 357/81 |

Primary Examiner—Edward J. Wojciechowicz
Attorney, Agent, or Firm—Craig and Antonelli

[57] ABSTRACT

A semiconductor device is disclosed wherein a semiconductor pellet is attached on a heat sink of a flange, leads are connected to corresponding electrodes of the semiconductor pellet directly or through wires, the semiconductor pellet and portions of the leads are sealed by resin mold on the flange and top outer periphery of the heat sink is formed with a projection to prevent peel-off of the resin mold and cracking of the resin mold which would otherwise occur due to difference between coefficients of thermal expansion of the flange and the resin mold.

12 Claims, 13 Drawing Figures

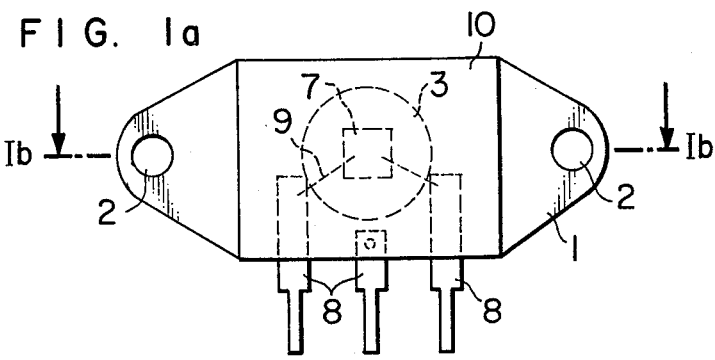
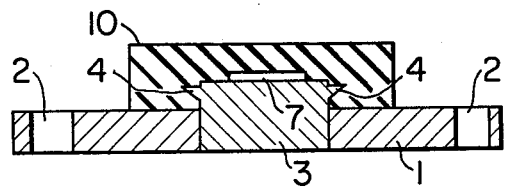
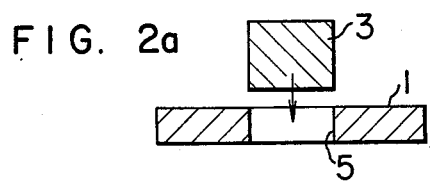
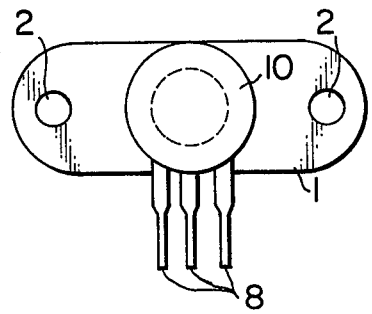
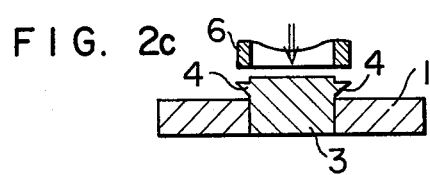

RESIN SEALED SEMICONDUCTOR DEVICE

LIST OF PRIOR ART REFERENCES

The following references are cited to show the state of the art:
U.S. Pat. No. 3,478,420
U.S. Pat. No. 3,606,673

BACKGROUND OF THE INVENTION

1. Field of the Invention

The present invention relates to a resin sealed semiconductor device and it is primarily useful in a power transistor.

2. Description of the Prior Art

In a resin sealed, relatively small size power transistor is disclosed in U.S. Pat. No. 3,478,420, a semiconductor pellet is fixed on a copper header, electrodes of the semiconductor pellet are connected to corresponding lead directly or through wires and the semiconductor pellet and the lead wires are surrounded and sealed by a resin mold such as silicon resin, epoxy resin, etc. on the header.

In such a resin sealed semiconductor device, because of a large difference between coefficients of thermal expansion of the header and the resin mold, the resin mold may peel-off the copper header or the resin mold may be cracked after the completion of the resin sealing or during a heat cycle test, a kind of life expectancy test.

Accordingly, in the small size power transistor, a projection is formed at a portion on the side of the header covered with the resin mold so that the projection constrains the shrinkage of the resin mold toward the center thereof immediately after the completion of the resin sealing for preventing the peel-off of the resin mold and the cracking of the resin mold which would otherwise occur by the difference between the coefficients of thermal expansion of the header and the resin mold (header: $17 \times 10^{-6} \deg^{-1}$, resin mold: $21 - 22 \times 10^{-6} \deg^{-1}$).

In a relatively large power transistor in which a flange having a heat sink is used as a support for the semiconductor pellet, however, the peel-off of the resin mold and the cracking of the resin mold due to the difference between the coefficients of thermal expansion may be prevented to a certain degree by providing the projection at a portion of the flange like in the small size power transistor but cracking may occur at a thin portion of the resin mold at which the projection is formed and the contact between the resin mold and the flange is so insufficient that the resin mold may be peeled off. Particularly in a semiconductor device in which the semiconductor device is clamped to a circuit board or the like by clamping the flange on both sides thereof, it is difficult to form the projection on that side of the flange on which a mounting bore is formed and a gap may be created between the resin mold and the flange by the clamp. This poses a problem of anti-humidity property of the resin mold.

Although the occurrence of the cracking of the resin mold may be relieved by coating the projection with a thick resin body, the use of increased amount of resin mold leads to the increase in cost and hence the problem of peel-off of the resin mold still remains unresolved.

SUMMARY OF THE INVENTION

It is an object of the present invention to prevent the peel-off of the resin mold and the cracking of the resin mold which would occur due to the difference between the coefficients of thermal expansion of the flange and the resin mold.

It is other object of the present invention to resolve the problem of anti-humidity property which would occur when a relatively large semiconductor device is clamped on both sides thereof.

It is a further object of the present invention to reduce a manufacturing cost of the resin sealed semiconductor device.

The above objects are achieved by a resin sealed semiconductor device of the present invention in which a semiconductor pellet is fixed on a heat sink of a flange, leads are connected to corresponding electrodes of the semiconductor pellet directly or through wires, the semiconductor pellet and portions of the leads are surrounded and sealed by a resin body on the flange, and a projection is formed on a top periphery of the heat sink.

BRIEF DESCRIPTION OF THE DRAWINGS

FIG. 1a shows a plan view of one embodiment of the present invention and FIG. 1b shows a sectional view taken along a line Ib — Ib in FIG. 1a.

FIGS. 2a to 2c show sectional views in the respective steps illustrating one method for forming a projection according to the present invention.

FIG. 3 shows a plan view illustrating a seal structure in one embodiment of the present invention.

FIG. 4a shows a plan view of another embodiment of the present invention and FIG. 4b shows a sectional view taken along a line IVb — IVb in FIG. 4a.

FIG. 6a shows a plan view of a further embodiment of the present invention and FIG. 6b shows a sectional view taken along a line VIb — VIb in FIG. 6a.

DESCRIPTION OF THE PREFERRED EMBODIMENTS

Figure 4A:
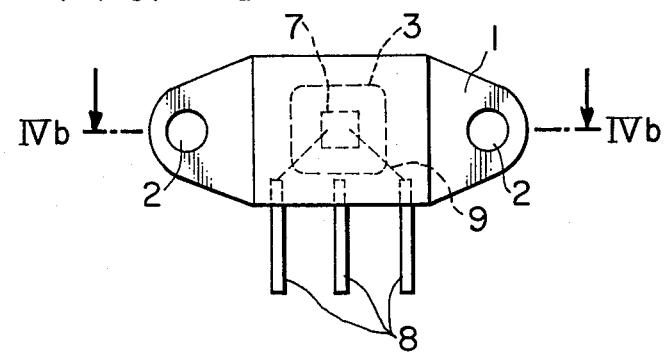

Referring to FIG. 1a and FIG. 1b, a resin-sealed large-size power transistor which is to be clamped on both sides thereof is shown as one embodiment of the present invention.

In FIG. 1a and FIG. 1b, numeral 1 denotes an iron flange which is to be clamped on both sides thereof. Mounting bores 2 to be used in mounting the transistor to a circuit board or the like are formed at opposite ends of the flange 1. Numeral 3 denotes a heat sink made of a copper cylinder. It is fixed by caulking at the center of the iron flange 1 with a top thereof projecting beyond the top surface of the flange. On an outer periphery of the top portion of the copper heat sink 3 which projects beyond the flange, there is formed a projection 4 which projects around entire side periphery.

The projection 4 may be formed, as shown in FIG. 2, by mounting the copper heat sink 3 on the iron flange 1 formed with the mounting bores 5 such that the copper heat sink 3 projects above the iron flange 1, striking the top surface of the heat sink 3 which has been fixed by caulking such that the peripheral edge of the top surface protrudes beyond the side surface, and then striking the top of the heat sink by a ring mold 6 to caulk the heat sink 3 so that the heat sink 3 is fixed to the flange. The extent of the lateral protrusion of the projection 4 may be 0.2 mm, for example.

A semiconductor pellet 7 which may be a transistor device is soldered to the copper heat sink 3. Numeral 8 denotes copper or iron leads which are used as emitter, collector and base leads, respectively. The electrodes of the semiconductor pellet 7 are connected to the corresponding leads 8 through Au wires 9. On the iron flange 1, a sealing body 10 surrounds and seals the copper heat sink 3, the semiconductor pellet 7 and portions of the leads 8 to which the wire 9 are connected.

With this structure, the shrinkage of the resin mold toward the center thereof from the outer periphery thereof after the resin sealing is constrained by the projection formed on the side periphery at the top of the copper heat sink to allow close contact between the heat sink and the resin mold. As a result, the peel-off of the resin mold and the cracking of the resin mold which would occur due to the difference between the coefficients of thermal expansion can be fully prevented.

Furthermore, where the transistor is to be mounted on the circuit board or the like with both sides thereof being clamped, the heat sink is in intimate contact with the resin mold and the resin mold is mechanically supported by the projection. Accordingly, there is no possibility of the occurrence of a gap between the heat sink to which the semiconductor pellet is fixed and the resin mold even if there exists a certain gap between the resin mold and the outer flange due to the clamping during the mounting. Thus, no problem is raised as to the anti-humidity property of the resin mold.

Accordingly, a highly reliable, resin sealed power transistor can be provided.

In addition, according to the present invention, it is not necessary to use large amount of resin in order to prevent the cracking of the resin mold but the resin mold is constrained and supported by the projection of the heat sink. Therefore, it is enough to use a small amount of resin sufficient to surround only the heat sink to which the semiconductor pellet is fixed. Accordingly, as shown in FIG. 3, by surrounding and sealing only the heat sink 3 to which the semiconduconductor pellet 7 is fixed, the amount of resin required is minimized and hence a cheap, resin-sealed power transistor can be provided.

Figure 4B:
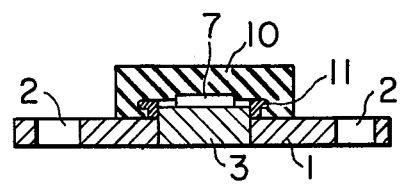

FIG. 4 shows another embodiment of the resin-sealed power transistor of the present invention.

In FIG. 4, numeral 1 denotes an iron flange having mounting bores 2 formed at opposite ends thereof. Numeral 3 denotes a copper heat sink which is fixed by caulking at the center of the flange 1 with a top thereof protruding from the top surface of the flange. Around the entire outer periphery of the protruding top of the heat sink 3, there is formed a ring-shaped projection 11 made of copper based material or iron based material.

The projection 11 is mounted by fitting it to the heat sink 3 and caulking the same. A semiconductor pellet 7 is soldered to the heat sink 3 and electrodes of the semiconductor pellet 7 are connected to corresponding leads 8 through wires 9. Like in the previous embodiment, the semiconductor pellet fixed to the heat sink 3 and the inner ends of the leads 8 to which the wires 9 are connected are surrounded and sealed by a resin mold 10 on the flange 1.

With this construction, since the projection formed around the top outer periphery of the heat sink is constructed by the ring-shaped projection, the extent of protrusion of the ring-shaped projection can be selected to any desired length. Accordingly, the use of a sufficiently protruding projection, the resin mold can be constrained and the heat sink can be intimately contacted to the resin mold. Therefore, the peel-off of the resin mold and the cracking of the resin mold which would occur due to the difference between the coefficients of thermal expansion can be fully prevented.

Furthermore, since the resin mold is mechanically supported by the projection having a large protrusion, there occurs no gap between the heat sink and the resin mold. Therefore, a resin-sealed transistor having a high anti-humidity property can be provided.

Figure 5A:
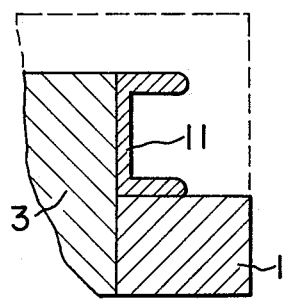
FIGS. 5a, 5b and 5c show sectional views illustrating modification of a major portion of the other embodiment of the present invention.
Figure 5B:
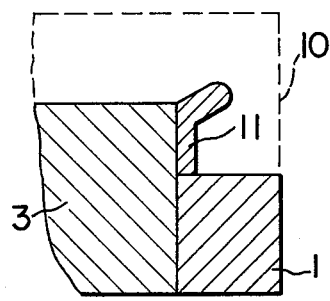
Figure 5C:
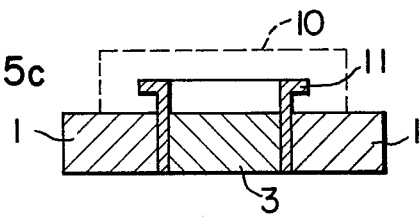

FIGS. 5a, 5b and 5c show other embodiments in which ring-shaped projections 11 are mounted on the heat sink.

In FIG. 5a, the ring-shaped projection 11 is of bobbin shape. In this embodiment, since the shape of ring is vertically symmetrical, the ring may be inserted in either face-up position or face-down position when it is mounted on the heat sink. Accordingly, the mounting operation of the ring projection 11 is simplified.

In FIG. 5b, the direction of the protrusion of the ring projection 11 is upwardly inclined. In this embodiment, for a given extent of protrusion, the resin mold can be more heavily constrained.

In FIG. 5c, the ring projection 11 comprises a high wall ring body. In this embodiment, the ring projection 11 is fitted in a space between the iron flange 1 and the copper heat sink 3. This embodiment may be advantageous where the heat sink does not substantially protrude beyond the top surface of the flange.

The shape of the heat sink may be cylindrical or rectangular with the ring projection 11 being contoured into a complementary ring shape.

Figure 6A:
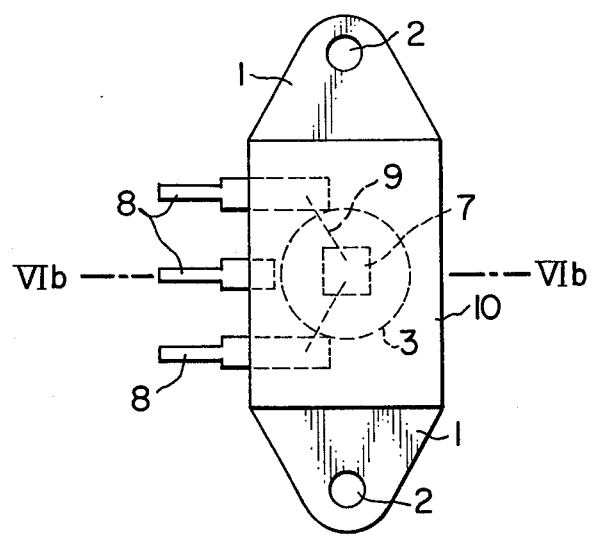
Figure 6B:
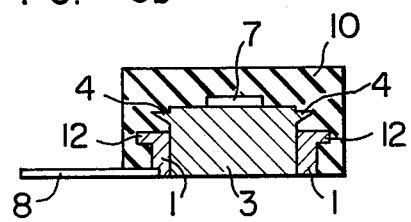

FIG. 6 shows a further embodiment of the present invention. In this embodiment, around the outer periphery on a protruding top of a heat sink 3, there is formed a projection 4 which protrudes around entire outer periphery thereof, and an additional projection 12 for constraining a resin mold 10 is provided on those sides of a flange 1 on which mounting bores 2 are not formed. In this embodiment, since the resin mold is constrained by both the projection 4 at the heat sink and the projection 12 at the flange, the peel-off of the resin mold and the cracking of the resin mold which would occur due to the difference between the coefficients of thermal expansion of the flange including the heat sink and the resin mold can be fully prevented. Furthermore, since the resin mold is supported by the two projections, mechanical strength is increased and there occurs no gap between the resin mold and the flange or the heat sink when the device is clamped to the circuit board or the like on both sides thereof. Accordingly, an anti-humidity and reliable, resin sealed semiconductor device can be provided.

The present invention is not limited to the particular embodiments described above but the leads may be connected directly to the electrodes of the semiconductor pellet without using the wires.

Although the present invention is primarily applicable to a resin-sealed power transistor which is to be clamped or both sides thereof, it may also be applicable to a resin-sealed power transistor which is to be clamped on one side or other type of resin sealed semiconductor device.

As described hereinabove, according to the present invention, since the projection is provided on the upper side surface of the heat sink, the peel-off of the resin mold and the cracking of the resin mold, which would occur due to the difference between the coefficients of thermal expansion of the flange including the heat sink and the resin mold after the completion of the resin sealing or during the temperature cycle test, are prevented. Furthermore, by the provision of the projection, the heat sink is intimately contacted to the resin mold and the mechanical strength is increased. Therefore, there occurs no gap between the resin mold and the flange during clamping. This enhances the antihumidity property of the resin mold and improves the reliability of the resin sealed semiconductor device. Furthermore, according to the present invention, the amount of resin required for sealing is substantially reduced and hence a substantial reduction of cost is attained.

We claim:

1. A resin sealed semiconductor device comprising:
    a flange;
    a heat sink mounted at the center of said flange, said heat sink protruding from a top surface of said flange;
    a semiconductor pellet fixed on said heat sink;
    leads electrically connected to electrodes of said semiconductor pellet through wires;
    a resin mold on said flange for surrounding and sealing said semiconductor pellet fixed on said heat sink and inner ends of said leads; and
    a projection formed around an outer periphery at the protruding portion of said heat sink.

2. A resin-sealed semiconductor device according to claim 1 wherein said projection is integral with said heat sink.

3. A resin sealed semiconductor device according to claim 1 wherein said projection is a ring which is fitted around the periphery of said heat sink.

4. A resin sealed semiconductor device according to claim 3 wherein said ring is a bobbin having a pair of vertically symmetrical protrusions.

5. A resin sealed semiconductor device according to claim 3 wherein said ring has an upwardly inclined protrusion.

6. A resin sealed semiconductor device according to claim 3 wherein said ring is fitted in a space between said flange and said heat sink.

7. A resin sealed semiconductor device according to claim 2 wherein said heat sink is fixed to said flange by caulking.

8. A resin sealed semiconductor device according to claim 3 wherein said heat sink is fixed to said flange by caulking.

9. A resin sealed semiconductor device according to claim 1 wherein said flange is formed with a mounting bore at least one end thereof.

10. A resin sealed semiconductor device according to claim 9 wherein an additional projection for constraining said resin mold is provided on that side of said flange on which said mounting bore is not formed.

11. A resin sealed power transistor comprising:
    an iron flange having mounting bores formed at opposite ends thereof, said mounting bores being for use in mounting said resin sealed power transistor to a circuit board;
    a copper cylinder heat sink fixed at the center of said iron flange by caulking, said heat sink protruding from the top surface of said flange;
    a transistor pellet fixed on said heat sink;
    copper or iron leads electrically connected to electrodes of said transistor pellet through wires;
    a resin mold on said flange for surrounding and sealing said copper heat sink, said semiconductor pellet and portions of said leads; and
    a projection formed integrally with said heat sink around the entire outer periphery of said heat sink at the protruding portion thereof.

12. A resin-sealed power transistor comprising:
    an iron flange having mounting bores formed at opposite ends thereof, said mounting bores being for use in mounting said resin sealed power transistor on a circuit board;
    a copper cylinder heat sink fixed at the center of said iron flange by caulking, said heat sink protruding from the top surface of said flange;
    a transistor pellet fixed on said heat sink;
    copper or iron leads electrically connected to electrodes of said transistor pellet through wires;
    a resin mold on said flange for surrounding and sealing said copper heat sink, said semiconductor pellet and portions of said leads; and
    a copper or iron ring-shaped projecting body fitted around an outer periphery of said heat sink at the protruding portion thereof.

* * * * *